US010734476B2

(12) United States Patent
Menta et al.

(10) Patent No.: US 10,734,476 B2
(45) Date of Patent: Aug. 4, 2020

(54) INTEGRATED ELECTRONIC DEVICE INCLUDING AN EDGE TERMINATION STRUCTURE WITH A PLURALITY OF DIODE CHAINS

(71) Applicant: STMICROELECTRONICS S.R.L., Agrate Brianza (IT)

(72) Inventors: Fernando Giovanni Menta, Catania (IT); Salvatore Pisano, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 14 days.

(21) Appl. No.: 16/186,421

(22) Filed: Nov. 9, 2018

(65) Prior Publication Data

US 2019/0148483 A1 May 16, 2019

(30) Foreign Application Priority Data

Nov. 14, 2017 (IT) .......................... 102017000129962

(51) Int. Cl.
*H01L 27/06* (2006.01)
*H01L 29/06* (2006.01)
(Continued)

(52) U.S. Cl.
CPC ...... *H01L 29/0619* (2013.01); *H01L 27/0629* (2013.01); *H01L 27/0647* (2013.01);
(Continued)

(58) Field of Classification Search
CPC ............. H01L 27/0629; H01L 27/0647; H01L 29/0619; H01L 29/16; H01L 29/7395;
(Continued)

(56) References Cited

U.S. PATENT DOCUMENTS 6,603,185 B1 * 8/2003 Jimbo ................. H01L 27/0611
257/488
2017/0011952 A1 * 1/2017 Saito .................... H01L 29/7811

FOREIGN PATENT DOCUMENTS

| JP | 2002118230 A | 4/2002 |
| JP | 2013041994 A | 2/2013 |
| JP | 2015065217 A | 4/2015 |

\* cited by examiner

*Primary Examiner* — Long K Tran
(74) *Attorney, Agent, or Firm* — Seed Intellectual Property Law Group LLP

(57) ABSTRACT

An integrated electronic device forming a power device and including: a semiconductor body; a first conductive region and a second conductive region, which extend over the semiconductor body, the second conductive region surrounding the first conductive region at a distance; and an edge termination structure, which is arranged between the first and second conductive regions and includes a dielectric region, which delimits an active area of the power device, and a semiconductive structure, which extends over the dielectric region and includes a plurality of diode chains, each diode chain including a plurality of first semiconductive regions of a first conductivity type and a plurality of second semiconductive regions of a second conductivity type, the first and second semiconductive regions being arranged in alternating fashion so as to form a series circuit including a plurality of first and second diodes, which are spaced apart from one another and have opposite orientations.

17 Claims, 6 Drawing Sheets

(51) Int. Cl.
   *H01L 29/866* (2006.01)
   *H01L 29/739* (2006.01)
   *H01L 29/78* (2006.01)
   *H01L 29/861* (2006.01)

(52) U.S. Cl.
   CPC ...... *H01L 29/7395* (2013.01); *H01L 29/7808* (2013.01); *H01L 29/7811* (2013.01); *H01L 29/861* (2013.01); *H01L 29/866* (2013.01)

(58) Field of Classification Search
   CPC ... H01L 29/7811; H01L 29/861; H01L 29/866
   USPC .......................................................... 257/40
   See application file for complete search history.

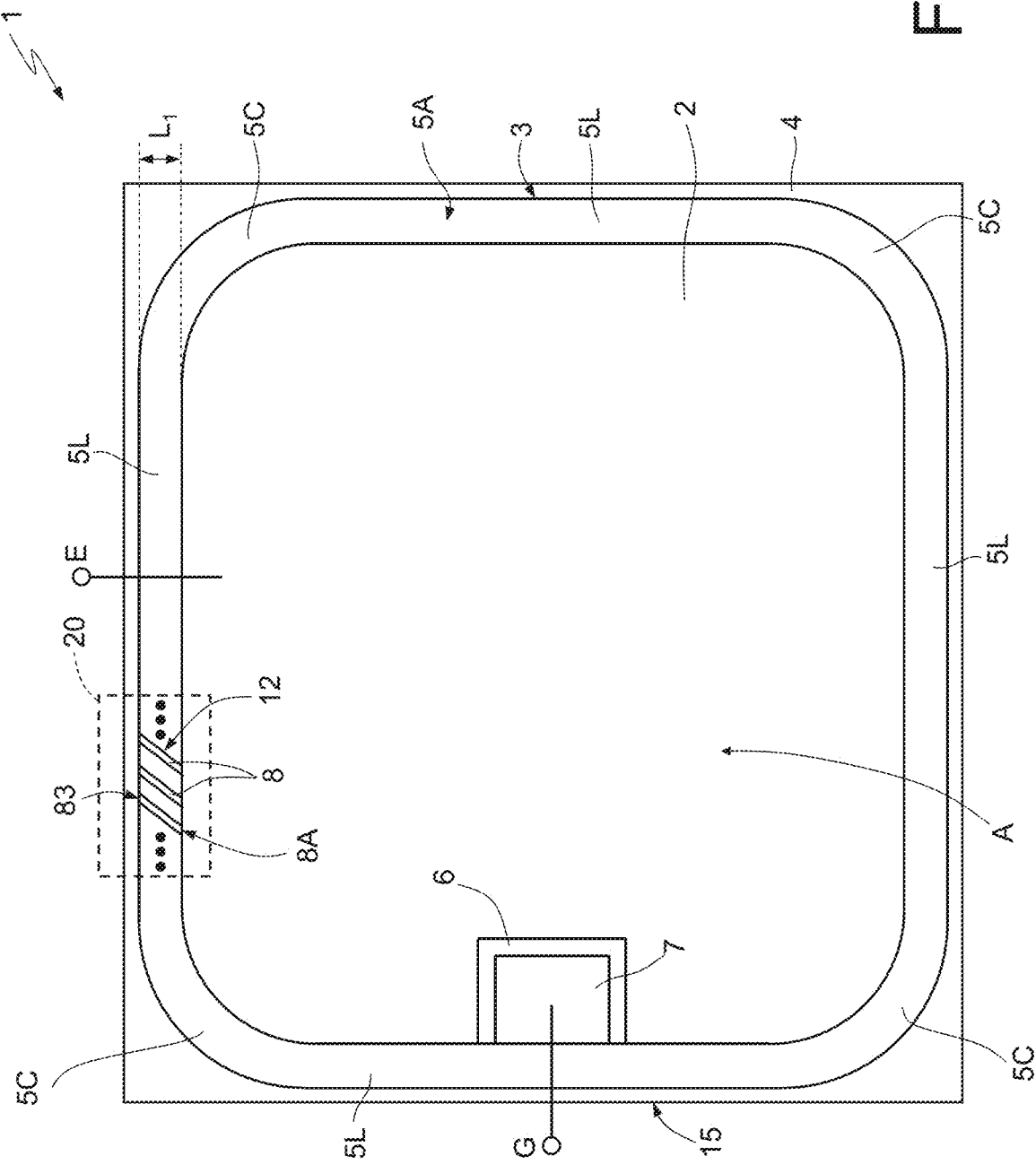

INTEGRATED ELECTRONIC DEVICE INCLUDING AN EDGE TERMINATION STRUCTURE WITH A PLURALITY OF DIODE CHAINS

BACKGROUND

Technical Field

The present disclosure relates to an integrated electronic device including an edge termination structure comprising a plurality of diode chains.

Description of the Related Art

As is known, in the field of integrated electronic devices, and in particular in the field of power integrated electronic devices, there is a desire to have available devices capable of withstanding increasingly high voltages. In fact, the availability of devices capable of withstanding high voltages enables simplification of the design of the power circuits, as well as reduction of the production costs.

Furthermore, there is a desire to have available power integrated electronic devices that will be stable and reliable over time, even in the presence of variable environmental conditions.

In particular, current power integrated electronic devices belonging to a medium-to-high voltage class (for example, higher than 600 V) typically have edge termination structures, which are designed for withstanding electrical fields close to the critical electrical-field value and, thus, voltages close to the breakdown voltage.

Examples of integrated electronic devices with edge termination structures are represented, for example, by power MOS (metal-oxide-semiconductor) transistors, power BJTs (bipolar junction transistors), IGBTs (insulated-gate bipolar transistors), or thyristors.

This having been said, the stability and reliability of an integrated electronic power device including an edge termination structure are affected by the manufacturing process and by the materials used; in fact, in the manufacturing stage, it is possible for the materials used to be contaminated by external agents, which may cause formation of point defects, surface charges, and the like. Likewise, the use of materials containing a large number of defects or low-performance passivation materials may also cause formation, in the integrated electronic device, of various charge-density imperfections.

As has been mentioned, the presence of charge-density imperfections may cause problems of reliability and stability over time; in fact, these imperfections lead to a poor control of the distribution of potential within the integrated electronic device. In this connection, it is known that the dependence of the distribution of potential upon the charge density is expressed by Poisson's equation:

$$\nabla^2 \Phi = -\frac{\rho}{\varepsilon_0} \quad (1)$$

where $\Phi$ is the electrical potential, $\rho$ is the charge density, and $\varepsilon_0$ is the vacuum dielectric constant.

As may be noted from Eq. (1), the presence of point defects, surface charges, and the like causes introduction of terms of charge density additional to what is expected on the basis of the distribution of dopant species within the integrated electronic device. These additional terms of charge density determine behaviors of electrical field and potential that are hard to control; for example, these terms may generate undesired peaks of electrical field. Furthermore, in the presence of a possible variation of the environmental conditions (for example, of humidity or temperature), the undesired effects caused by these additional terms of charge density are amplified. It follows that the design of an integrated electronic power device including an edge termination structure is problematical.

To overcome at least in part the aforementioned problems, the most recent solutions envisage forming edge termination structures with floating rings or else edge termination structures with variable lateral doping (VLD). However, these solutions are complex at a design level and require the use of a considerable amount of silicon to obtain them. Furthermore, the solutions referred to are based upon the implantation of dopant species in the substrate of the integrated electronic device, which, as is evident from Eq. (1), impose the distribution of potential by variation of the charge density $\rho$. Control of the potential profile is thus based upon a sort of compensation of the additional terms of charge density as a function of an expected distribution of the latter; in the case where the actual distribution of the additional terms of charge density depart from the expected distribution, the compensation may prove insufficient.

In the light of the foregoing, there appears evident a desire to control effectively the distribution of potential within an integrated electronic device in an economically advantageous way and, possibly, without requiring a marked increase of the area of the integrated electronic device.

BRIEF SUMMARY

An aim of the present disclosure is to provide an integrated electronic device with edge termination structure that will overcome at least in part the drawbacks of the prior art.

According to one or more embodiments of the present disclosure, an integrated electronic device includes a semiconductor body; a first conductive region and a second conductive region, which extend on top of the semiconductor body, the second conductive region laterally enclosing, at a distance, the first conductive region; and an edge termination structure, arranged between the first and second conductive regions and including a dielectric region, which delimits an active area of the electronic device, said first conductive region extending at least in part on top of the active area. The edge termination structure further comprises a semiconductive structure, which extends on top of the dielectric region and comprises a plurality of diode chains, each diode chain having a first end and a second end, which are electrically coupled, respectively, to the first and second conductive regions. Each diode chain comprises a plurality of first semiconductive regions, which have a first conductivity type, and a plurality of second semiconductive regions, which have a second conductivity type, said first and second semiconductive regions being arranged in alternating fashion so as to form a series circuit including a plurality of first and second diodes having opposite orientations.

BRIEF DESCRIPTION OF THE SEVERAL VIEWS OF THE DRAWINGS

For a better understanding of the present disclosure, a preferred embodiment thereof is now described, purely by way of non-limiting example, with reference to the attached drawings, wherein:

FIG. 1A is a schematic top plan view with portions removed of an embodiment of the present integrated electronic device;

DETAILED DESCRIPTION

FIG. 1A shows an integrated electronic device, designated by 1, which operates at high voltage and is provided with an edge termination structure 3; in particular, the integrated electronic device 1 has a quadrangular shape (for example, square) in top plan view.

The integrated electronic device 1 comprises a power device 15, such as an IGBT having a gate metallization G, a collector metallization C (visible in FIG. 1B), and an emitter metallization E, which form corresponding terminals of the power device 15. Further, the power device 15 belongs to a voltage class $V_{CES}$, for example equal to or higher than 600 V.

As described in greater detail hereinafter, the integrated electronic device 1 also comprises an equipotential ring 4. Further, the equipotential ring 4 and the gate metallization G and the emitter metallization E are arranged in a first plane parallel to a plane XY of a reference system XYZ.

Figure 1B:
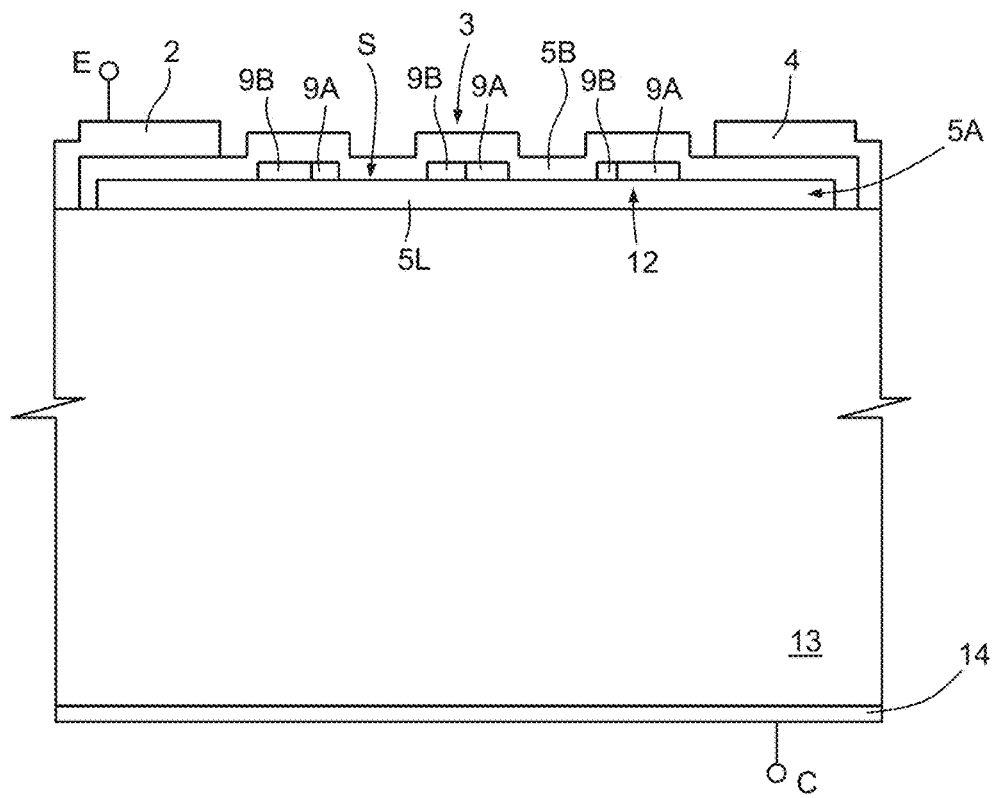
FIG. 1B is a schematic cross-sectional view of a portion of the device of FIG. 1A, taken along a line of section IB-IB illustrated in FIG. 2.

As illustrated in FIG. 1B, the integrated electronic device 1 further comprises: a semiconductor body 13, made for example of silicon; a metal region 2 (for example, aluminum), which forms the emitter metallization E and extends over the semiconductor body 13, contacting it at least in part; a gate region 7 which forms the gate metallization G; an annular edge termination structure 3, comprising at least one first dielectric region 5A (made, for example, of silicon oxide, $SiO_2$), which extends over the semiconductor body 13, in direct contact therewith; and the aforementioned equipotential ring 4 of metal (for example, aluminum), which extends over the semiconductor body 13, contacting it at least in part. The metal region 2 is a first conductive region and the ring 4 is a second conductive region and both extend on top of the semiconductor body 13. The second conductive region 4 surrounds, at a distance, the first conductive region 2.

Albeit not illustrated, the integrated electronic device 1 is such that the potential present on the back of the semiconductor body 13, and in particular on a bottom metal layer 14 arranged on the underside of the semiconductor body 13 and forming the collector metallization C, is applied on the equipotential ring 4.

In detail, the first dielectric region 5A has a quadrangular annular shape with rounded corners and is positioned laterally between the metal region 2 and to the equipotential ring 4 and between the gate region 7 and the ring 4. In fact, to a first approximation, the first dielectric region 5A laterally encloses the metal region 2 and gate region 7 and is in turn surrounded by the equipotential ring 4.

In greater detail, the first dielectric region 5A is delimited on the top by a surface S. In addition, the first dielectric region 5A comprises four rectilinear portions, designated by 5L, and four curved portions, designated by 5C. The four rectilinear portions 5L of the first dielectric region 5A are arranged according to the sides of a rectangular/square shape and further have a substantially constant width and are the same as one another. Each curved portion 5C of the first dielectric region 5A contacts two corresponding rectilinear portions 5L, between which it is arranged.

The annular termination structure 3 further comprises a polysilicon region 12, which, as described in greater detail hereinafter, extends on the surface S and is arranged between the metal region 2 and the equipotential ring 4 and between the gate region 7 and the ring 4. Furthermore, the annular termination structure 3 comprises a second dielectric region 5B, which extends on the polysilicon region 12 and on the exposed portions of the first dielectric region 5A. For simplicity of representation, the second dielectric region 5B is illustrated only in FIGS. 1B, 1C 4B.

Without this implying any loss of generality, the metal regions 2, 7 extend in part over first peripheral portions (facing the metal regions 2, 7) of the second dielectric region 5B, which in turn overlie corresponding first peripheral portions of the first dielectric region 5A. Once again without this implying any loss of generality, the equipotential ring 4 extends in part over second peripheral portions of the second dielectric region 5B (opposite to the aforementioned first peripheral portions of the second dielectric region 5B, with respect to an imaginary line of symmetry of the second dielectric region 5B), which in turn overlie corresponding second peripheral portions of the first dielectric region 5A (opposite to the aforementioned first peripheral portions of the first dielectric region 5A, with respect to an imaginary line of symmetry of the first dielectric region 5A).

Once again without this implying any loss of generality, in top plan view the part of each rectilinear portion 5L of the first dielectric region 5A left exposed by the metal regions 2, 7 and by the equipotential ring 4 (and thus also the corresponding portion of the overlying second dielectric region 5B) has a rectangular shape, said shape having a substantially constant width (designated by $L_1$ in FIG. 1A).

Albeit not illustrated, the integrated electronic device 1 may further comprise a passivation region (made, for example, of silicon nitride $Si_3Ni_4$), which extends over the metal regions 2, 7, the equipotential ring 4, and the second dielectric region 5B.

The integrated electronic device 1 further comprises a gate insulating region 6, which in top plan view has a rectangular shape, and extending on which is the metal gate region 7, which is partially surrounded, at a distance, by the emitter metallization E. In top plan view, the gate region 7 leaves exposed a peripheral portion of the gate insulating region 6, which has the shape of a C facing the annular termination structure 3. The gate region 7 forms the gate metallization G of the power device 15 and extends, at a distance, over the semiconductor body 13.

More precisely, the metal regions 2, 7 together have an envelope of a rectangular shape with rounded corners (in top plan view), which is delimited laterally by the first and second dielectric regions 5A, 5B, assuming that the peripheral portions of the metal regions 2, 7 that extend over the first and second dielectric regions 5A, 5B are neglected. Present within the envelope of the metal regions 2, 7 is a portion of space occupied by the gate insulating region 6, which is laterally positioned between the emitter metallization E and the gate region 7. It may be assumed that the envelope of the metal regions 2, 7 delimits an underlying active area A of the power device 15; the emitter metallization E is thus substantially arranged on top of the active area A, but for a secondary portion that extends over the first and second dielectric regions 5A, 5B.

The polysilicon region 12 is formed by a plurality of diode chains 8, which are coplanar with respect to one another.

As mentioned previously, each diode chain 8 extends on the surface S of the first dielectric region 5A. Furthermore, although illustrated for simplicity in FIG. 1A are only diode chains 8 that extend on a single rectilinear portion 5L of the first dielectric region 5A, other diode chains 8 may extend on the other three rectilinear portions 5L of the first dielectric region 5A.

In greater detail, each diode chain 8 has a chain length $L_C$, taken in the direction of longitudinal extension of the diode chain 8, and a chain width $W_C$, taken in a direction perpendicular to the direction of longitudinal extension of the diode chain 8. The chain length $L_C$ is, for example, between 100 μm and 1000 μm; the chain width $W_C$ is, for example, between 1 μm and 10 μm.

Figure 2:
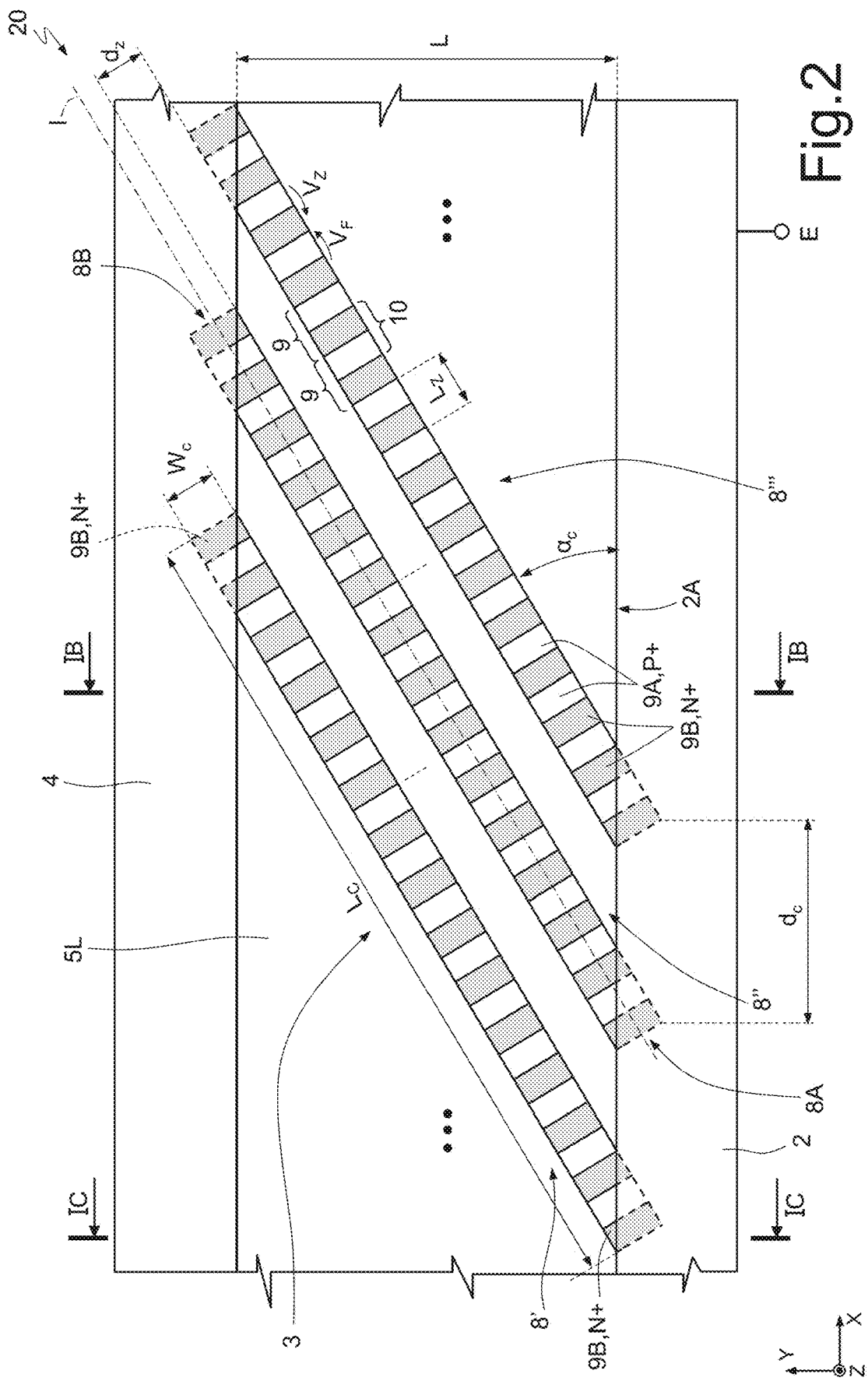
FIG. 2 is a schematic top plan view with portions removed of a detail of the integrated electronic device of FIG. 1A.

To facilitate an understanding of the present integrated electronic device 1, a detail of a region 20 thereof, shown in FIG. 1A in a dashed box, is represented at an enlarged scale in FIG. 2. In particular, FIG. 2 shows three diode chains, designated by 8', 8'', and 8''', which extend parallel to an inclined direction I, which forms a chain angle $0° < \alpha_C < 90°$ with respect to a rectilinear edge portion 2A of the active region 2, the latter extending in a direction parallel to the axis X of the reference system XYZ. The rectilinear portion 5L of the first dielectric region 5A, arranged on which are the three diode chains 8', 8'' and 8''', also extends parallel to the axis X. In other words, the three diode chains 8', 8'', and 8''' are arranged transversely, but not perpendicularly, with respect to the rectilinear portion 5L of the first dielectric region 5A.

In general, each diode chain 8 is delimited by a first chain terminal 8A and a second chain terminal 8B, which contact one of the metal regions 2, 7 and the equipotential ring 4, respectively.

In practice, the first chain terminal 8A enables connection of each diode chain 8 to either the emitter metallization E or the gate metallization G of the power device 15, whereas the second chain terminal 8B enables connection of each diode chain 8 to the equipotential ring 4, and thus to the metallization of the collector C of the power device 15.

In greater detail, each diode chain 8 is formed by a plurality of first and second diode regions 9A, 9B, which in top plan view have approximately a quadrangular shape (for example, rectangular). The first and second diode regions 9A, 9B are made of polysilicon and are substantially coplanar.

Each first diode region 9A has a conductivity of a P+ type (with a dopant level of, for example, $10^{17}$ $cm^{-3}$) and is formed, for example, by implantation of a corresponding portion of the material that forms the polysilicon region 12.

Each second diode region 9B has a conductivity of an N+ type (with a dopant level of, for example, $10^{19}$ $cm^{-3}$) and is formed by implantation of a corresponding portion of the material that forms the polysilicon region 12. As mentioned previously, the first and second diode regions 9A, 9B extend on the first dielectric region 5A.

In each diode chain 8, the respective first diode regions 9A are spaced apart from each other by the second diode regions 9B, in the direction of extension of the diode chain 8. Consequently, considering any diode region different from the diode regions that form the first and second chain terminals 8A, 8B, it is preceded and followed by a pair of diode regions of a type different from its own, with which it forms corresponding PN junctions; said PN junctions form corresponding diodes.

Figure 1C:
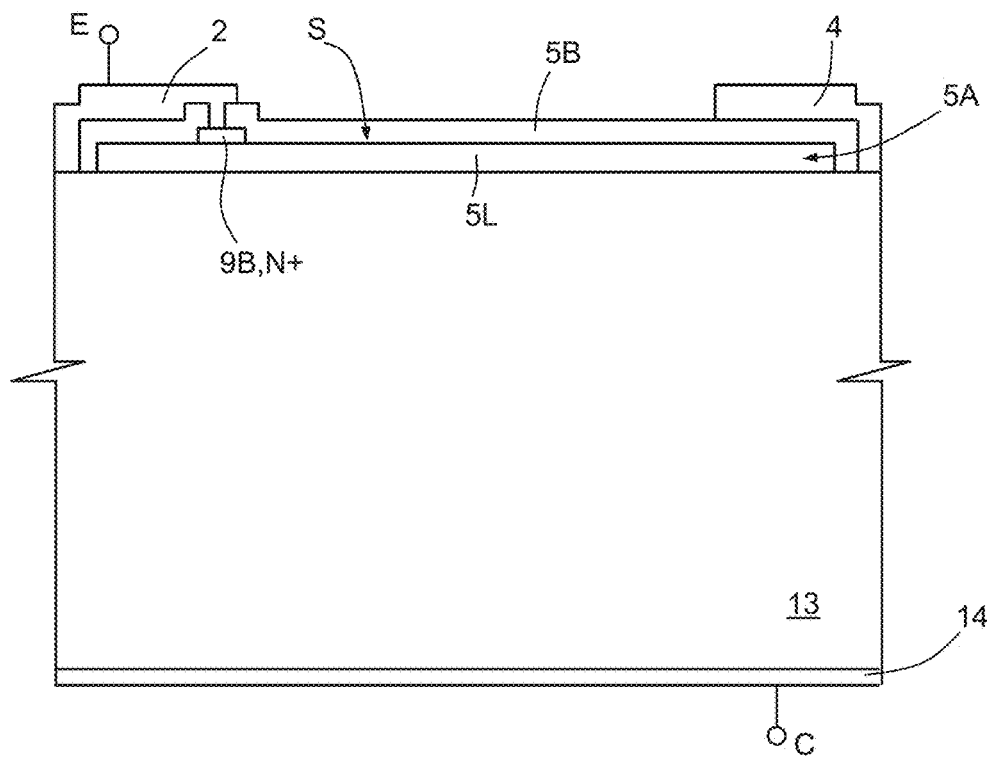
FIG. 1C is a schematic cross-sectional view of a portion of the device of FIG. 1A, taken along a line of section IC-IC illustrated in FIG. 2.

Without this implying any loss of generality, in FIG. 2 the first and second chain terminals 8A, 8B of each diode chain 8 are formed by diode regions of a same type (in particular, second diode regions 9B). In this connection, with reference, for example, to the second diode region 9B that forms the first chain terminal 8A of a respective diode chain 8, FIG. 1C shows how the second dielectric region 5B enables a part of said second diode region 9B to contact the emitter region 2. Similar considerations apply to the second chain terminal 8B and to the equipotential ring 4.

In greater detail, given, for example, one of the first diode regions 9A and a pair of second diode regions 9B adjacent to the given first diode region 9A, the following applies.

The first diode region 9A forms, together with the second diode region 9B arranged towards the metal region 2, a first diode, here designated by the reference number 9; in particular, the first diode 9 is a diode of a Zener type, i.e., a diode that is particularly suited to operating in reverse biasing (i.e., subjected to a negative voltage), and in particular in breakdown conditions, the latter being reached by the tunnel effect and at voltage values that are relatively low (in absolute value).

Furthermore, the first diode region 9A forms, together with the second diode region 9B arranged towards the equipotential ring 4, a second diode, here designated by reference number 10; also the second diode 10 is a diode of a Zener type, but has an orientation opposite to the first diode 9. In this connection, the first diode 9 has its anode facing the equipotential ring 4, whereas the second diode 10 has its anode facing the metal region 2.

The first diode 9 has a width equal to the chain width $W_C$ and a Zener length $L_Z$ (for example, of 7 μm), taken in the direction of extension of the diode chain 8. Without this implying any loss of generality, the second diode 10 has the same dimensions as the first diode 9. In this connection, in general the transverse arrangement of the diode chains 8 with respect to the underlying rectilinear portion 5L of the first dielectric region 5A enables an increase in the number of diode regions within each diode chain 8.

In practice, each second diode 10 shares its own cathode region with the first adjacent diode 9 arranged towards the equipotential ring 4. Likewise, each second diode 10 shares its own anode region with the first adjacent diode 9 arranged towards the metal region 2.

Figure 3:
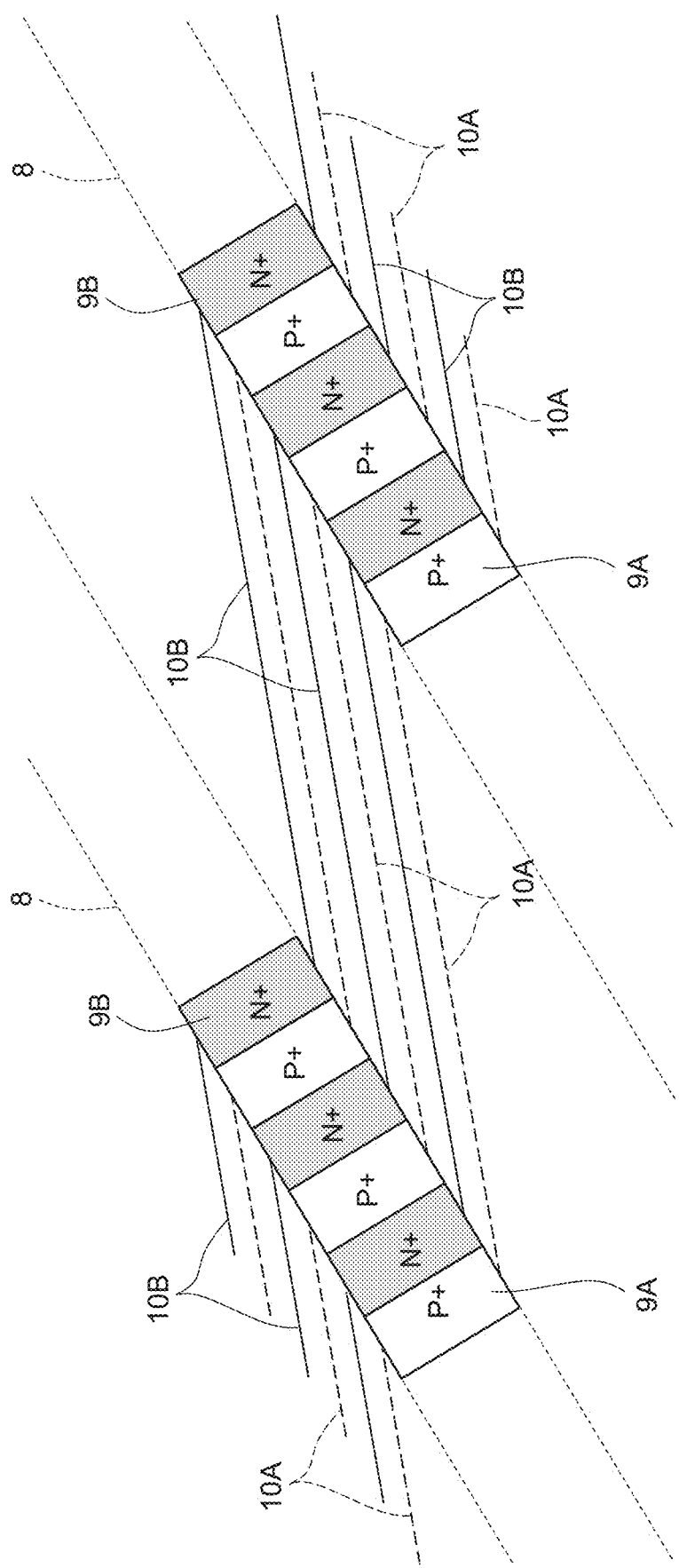
FIG. 3 is a schematic top plan view of a further detail of the device of FIG. 2, with portions removed.

As illustrated in FIGS. 2 and 3, and without this implying any loss of generality, diode chains 8 arranged on a same rectilinear portion 5L of the first dielectric region 5A are the same as one another, are laterally staggered, and have a same orientation. Furthermore, the diode chains 8 are arranged at a same height, this height being measured with respect to the axis Y, which is perpendicular to the axis X and such that the plane XY is parallel to the surface S of the first dielectric region 5A.

In addition, consecutive diode chains 8 are separated from one another by a distance $d_C$, taken along a direction parallel to the first axis X, for example, equal to 50 μm. Furthermore, each diode chain 8 is separated from an adjacent diode chain 8 by a distance $d_Z$, taken along the same direction of chain width $W_C$.

In general, the minimum value of the distance $d_Z$ may be comprised between a few micrometers and 100 µm; further, the upper limit for the distance $d_Z$ is given by the precision with which it is intended to control the distribution of potential of the integrated electronic device 1. For instance, the distance $d_Z$ may be 100 µm.

As illustrated in FIG. 3, extending between pairs of diode chains 8 that are adjacent and are arranged on a same rectilinear portion 5L of the first dielectric region 5A, is a plurality of first and second equipotential lines 10A, 10B.

The profile of the first and second equipotential lines 10A, 10B is described hereinafter, with reference, for simplicity, to a purely theoretical case; further, reference is made to a plane parallel to the plane XY, for example coinciding with the plane of the surface S of the first dielectric region 5A, even though in actual fact the equipotential lines extend, among other things, also within the first and second dielectric regions 5A, 5B, as well as within the semiconductor body 13. In this connection, to a first approximation, it may be assumed that the profile of the equipotential lines does not depend upon the position along the axis Z located on which is the aforementioned reference plane, provided that said plane intersects the first dielectric region 5A or the second dielectric region 5B or a top portion of the semiconductor body 13.

This having been said, each first equipotential line 10A has a rectilinear development and extends between a corresponding pair of first diode regions 9A of adjacent diode chains 8; likewise, each second equipotential line 10B has a rectilinear development and extends between a pair of second diode regions 9B of adjacent diode chains 8. For simplicity of representation, illustrated in FIG. 3 is, for each pair of diode regions, just one equipotential line arranged in between.

In greater detail, first and second equipotential lines 10A, 10B extend parallel to a same direction, transverse to the direction of extension of the pair of diode chains 8. In particular, the first and second equipotential lines 10A, 10B are inclined, with respect to the rectilinear portion 5L, by an angle $0°<\alpha_P<\alpha_C$. This is obtained thanks to the fact that each diode region has approximately a quadrangular shape, in top plan view, with two sides perpendicular to the inclined direction I and two sides parallel to the inclined direction I. Consequently, considering any diode region, one of the two sides parallel to the inclined direction I (referred to in what follows for brevity as the high side) has a height greater than the height of the other side parallel to the inclined direction I (referred to in what follows for brevity as the low side). Furthermore, given any pair of diode regions connected by a respective equipotential line, this equipotential line contacts the low side of one of the regions of said pair of diode regions and the high side of the other diode region.

In practice, as illustrated in FIG. 3, the distribution of the lines of the electrical field, and thus also of the electrical potential, is controlled also in the portions of space arranged between the diode chains.

This having been said, embodiments are possible in which the diode chains 8 formed on each rectilinear portion 5L of the first dielectric region 5 are not all equal. In this case, the polysilicon region 12 may be of the type illustrated in FIG. 4A.

Figure 4A:
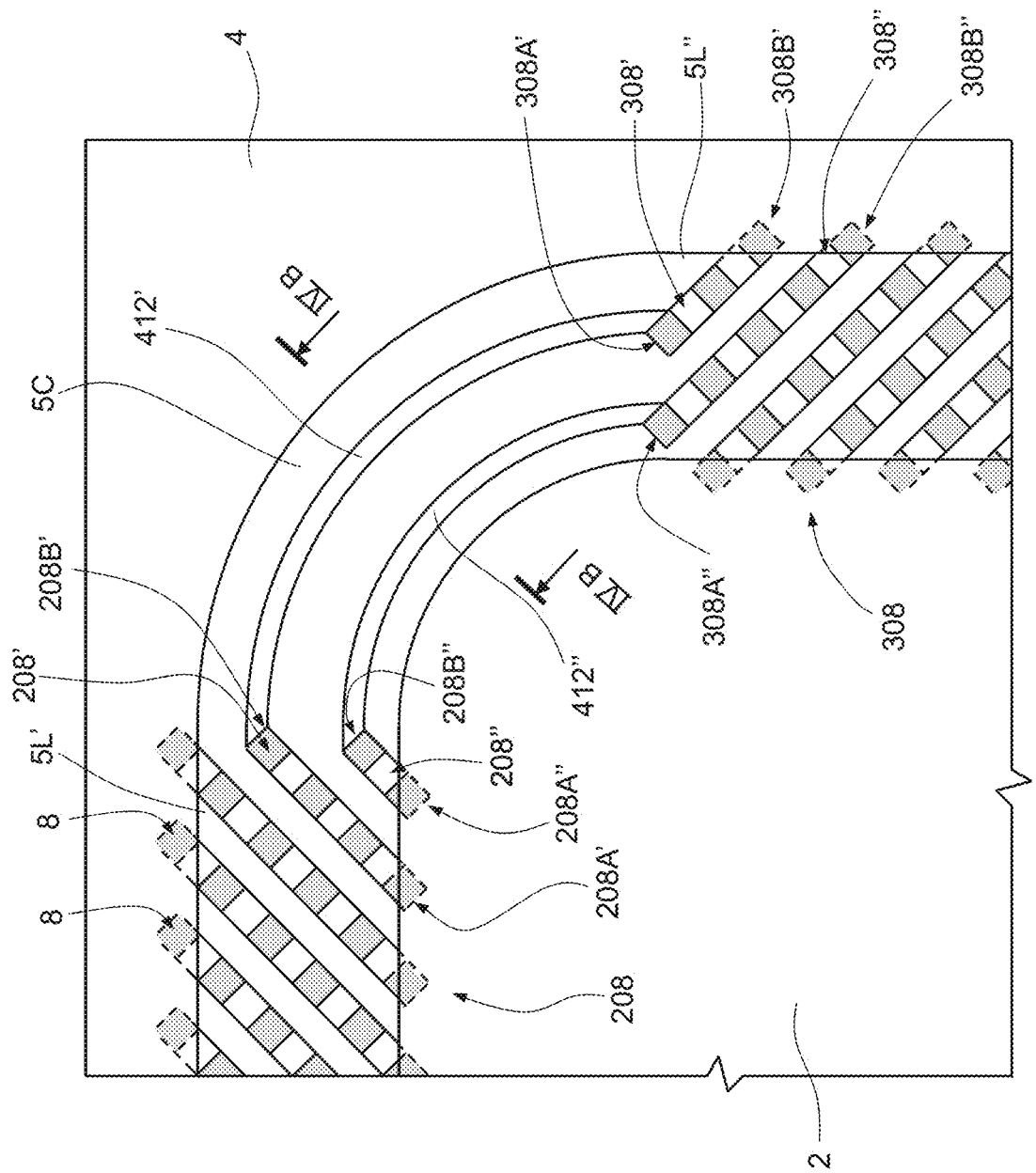
FIG. 4A is a schematic top plan view with portions removed of a portion of an embodiment of the present integrated electronic device.

In detail, FIG. 4A shows a curved portion 5C of the first dielectric region 5A, which extends between a pair of rectilinear portions designated by 5L' and 5L", referred to in what follows, respectively, as the first rectilinear portion 5L' and the second rectilinear portion 5L".

Also illustrated in FIG. 4A are a first set 208 of diode chains 8, which extend parallel to one another on the first rectilinear portion 5L', and a second set 308 of diode chains 8, which extend parallel to one another in the second rectilinear portion 5L".

In detail, the diode chains 8 of the first set 208 are not all the same as one another; in fact, the first set 208 comprises a pair of diode chains (designated, respectively, by 208' and 208"), which are the chains of the first set 208 that are at a shorter distance from the curved portion 5C and have shorter lengths than other diode chains 8 of the first set 208, the latter being the same as one another.

In greater detail, if the diode chains 208' and 208" are referred to, respectively, as the first and second edge chains, the first chain terminals of the first and second edge chains 208', 208" (designated, respectively, by 208A' and 208A") contact the metal region 2; the second chain terminals of the first and second edge chains 208', 208" (designated, respectively, by 208B' and 208B") are, instead, at a distance both from the metal region 2 and from the equipotential region 4, and lie, ideally, along a segment parallel to the axis Y that delimits, in top plan view, the curved portion 5C.

More in particular, the first chain terminals of all the diode chains of the first set 208 are arranged at a same height. In addition, the second edge chain 208" is arranged between the first edge chain 208' and the curved portion 12C of the polysilicon region 12. The first edge chain 208' is thus longer than the second edge chain 208"; further, the second chain terminal 208B' is arranged at a height greater than the second chain terminal 208B".

Likewise, the diode chains 8 of the second set 308 are not all the same as one another; in fact, the second set 308 comprises a pair of diode chains (designated, respectively, by 308' and 308"), which are the chains of the second set 308 that are at a shorter distance from the curved portion 5C and have shorter lengths than the other diode chains 8 of the second set 308.

In greater detail, if the diode chains 308' and 308" are referred to, respectively, as the third and fourth edge chains, the second chain terminals of the first and second edge chains 308', 308" (designated, respectively, by 308B' and 308B") contact the equipotential ring 4; the first chain terminals of the third and fourth edge chains 308', 308" (designated, respectively, by 308A' and 308A") are, instead, at a distance both from the equipotential ring 4 and from the metal region 2, and lie, ideally, along a segment parallel to the axis X that delimits, in top plan view, the curved portion 5C. More in particular, the second chain terminals of all the diode chains of the second set 308 are located at a same co-ordinate, taken parallel to the axis X; further, the third edge chain 308' is arranged between the fourth edge chain 308" and the curved portion 5C. The fourth edge chain 308" is thus longer than the third edge chain 308; further, the first chain terminal 308A' is located at a co-ordinate greater than that of the first chain terminal 308A".

In greater detail, the second set 308 is equal to the first set 208, with respect to which it is translated and rotated by 90° in a clockwise direction.

Figure 4B:
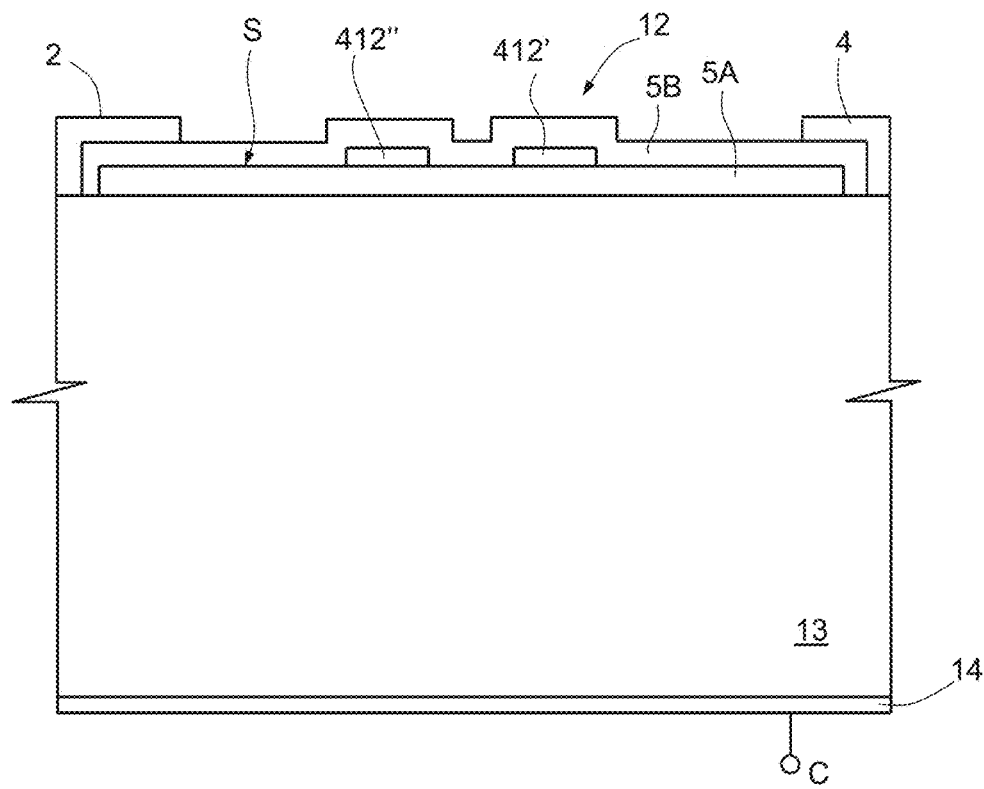
FIG. 4B is a schematic cross-sectional view of the device of FIG. 4A.

As illustrated also in FIG. 4B, the polysilicon region 12 comprises a first curved region 412' and a second curved region 412", which lie on the surface S of the first dielectric region 5A. Without this implying any loss of generality, each of the first and second curved regions 412', 412" has, in top plan view, the shape of a respective portion of annulus.

The first curved region 412' is arranged on the outside of the second curved region 412" and contacts, respectively, with its own ends, the second chain terminal 208B' of the first edge chain 208' and the first chain terminal 308A' of the third edge chain 308'. In this connection, the doping types of the second chain terminal 208B' of the first edge chain 208' and of the first chain terminal 308A' of the third edge chain 308' are irrelevant, provided that they are the same as one another. For instance, in the embodiment illustrated in FIG. 4A, the doping types of the second chain terminal 208B' of the first edge chain 208' and of the first chain terminal 308A' of the third edge chain 308' are of an N+ type; consequently, also the first curved region 412' is of an N+ type.

The second curved region 412" contacts, respectively, with its own ends, the second chain terminal 208B" of the second edge chain 208" and the first chain terminal 308A" of the fourth edge chain 308". Also in this case, the doping types of the second chain terminal 208B" of the second edge chain 208" and of the first chain terminal 308A" of the fourth edge chain 308" are irrelevant, provided that they are the same as one another. For instance, in the embodiment illustrated in FIG. 4A, the doping types of the second chain terminal 208B" of the second edge chain 208" and of the first chain terminal 308A" of the fourth edge chain 308" are of an N+ type; consequently, also the second curved region 412" is of an N+ type.

In practice, the first curved region 412' has a conductive behavior such that the potential present on the second chain terminal 208B' of the first edge chain 208' is substantially equal to the potential present on the first chain terminal 308A' of the third edge chain 308'. Consequently, the first edge chain 208' and the third edge chain 308' represent interrupted chains, which, together, form a diode chain that connects the metal region 2 and the equipotential ring 4 and that is electrically equivalent to the diode chains 8 different from the edge chains; for the purposes of the equivalence, the second chain terminal 208B', the first curved region 412', and the first chain terminal 308A' may be considered equivalent to a single diode region.

Likewise, the second curved region 412" has a conductive behavior such that the potential present on the second chain terminal 208B" of the second edge chain 208" is substantially equal to the potential present on the first chain terminal 308A" of the fourth edge chain 308". Consequently, the second edge chain 208" and the fourth edge chain 308" represent interrupted chains, which, together, form a corresponding diode chain that connects the metal region 2 and the equipotential ring 4 and that is electrically equivalent to the diode chains 8 different from the edge chains; for the purposes of the equivalence, the second chain terminal 208B", the second curved region 412", and the first chain terminal 308A" may be considered equivalent to a single diode region.

In this way, a good control of the potential profile is obtained also at the curved portions 5C of the first dielectric region 5A, as well as in the underlying portions of the semiconductor body 13.

Figure 5:
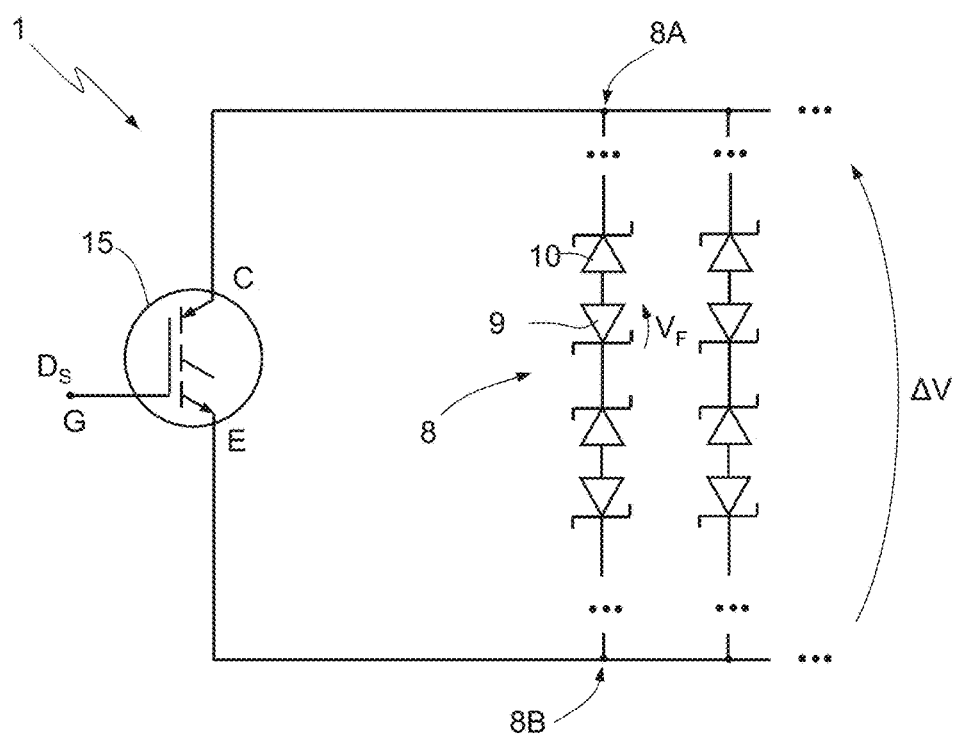
FIG. 5 shows a simplified equivalent electrical circuit of the present device.

For practical purposes, a simplified electrical diagram of the present integrated electronic device 1 is illustrated in FIG. 5.

In detail, FIG. 5 highlights the presence of a plurality of diode chains 8 connected in parallel between the collector terminal C and the emitter terminal E of the power device 15. Furthermore, each diode chain 8 includes a plurality of first Zener diodes (formed by the aforementioned first diodes 9) and a plurality of second Zener diodes (formed by the aforementioned second diodes 10).

When the power device 1 is on, i.e., when the gate terminal G is set at a nonzero voltage (for example, equal to 15 V), present between the collector terminal C and the emitter terminal E is a limited voltage (for example, of the order of volts); further, current flows between the emitter terminal E and the collector terminal C. Instead, when the power device 15 is off, no current flows between the emitter terminal E and the collector terminal C; further, present between the collector terminal C and the emitter terminal E is a high voltage (for example, 400 V).

In practice, when the power device 15 is off, the first diodes 9 operate in forward biasing, whereas the second diodes 10 operate in reverse biasing. Furthermore, the diode chains 8 are such that, in any case, no diode reaches the Zener voltage.

In greater detail, if the voltage present on the gate terminal G of the power device 15 is referred to as the driving signal $D_S$, the power device 15 is off when the driving signal $D_S$ is zero. In these conditions, denoting by $\Delta V$ the potential drop between the collector terminal C and the emitter terminal E, and thus between the second and first chain terminals 8B, 8A of each diode chain 8, the following relation applies:

$$\Delta V < n \cdot (V_F + V_Z) \qquad (2)$$

where n is the total number of first diodes 9 in each diode chain 8, whereas $V_F$ is the voltage drop on each first diode 9 (for example, 0.6 V). Furthermore, $V_Z$ is the Zener voltage (for example, 10 V), at which, once reached, the Zener effect would be triggered in the second diodes 10.

As mentioned previously, it is possible to size the annular termination structure 3 so that no diode reaches the Zener voltage. For instance, sizing of the edge termination structure 3 may be such that the natural breakdown voltage (also known as $BV_{CES}$) of the power device 15, for the (hypothetical) case where the annular termination structure 3 were absent, is lower than $n \cdot (V_F + V_Z)$. In this connection, the voltage $BV_{CES}$ is greater than the voltage class $V_{CES}$ of the power device 15, so that operation of the power device 15 will be guaranteed at the maximum voltage envisaged.

As highlighted by Eq. (2), the diode chains 8 impose a distribution of potential and, consequently, a distribution of electrical field in the integrated electronic device 1.

In other words, the presence of the diode chains 8 enables fixing of the value of voltage drop in the integrated electronic device 1 so as to prevent any failure or malfunctioning. Furthermore, imposition of the potential profile by the diode chains 8 renders the integrated electronic device 1 more resilient in regard to variations of environmental conditions, such as variations in temperature and humidity.

In greater detail, the present applicant has found that the diode chains 8 enable effective distribution of the voltage drop between the metal region 2 and the equipotential ring 4, attenuating localized peaks of electrical field due, for example, to defects or mobile charges; there is thus obtained a more regular and controlled distribution of potential.

In general, the chain width $W_C$, the Zener length $L_Z$, and the Zener voltage $V_Z$ are design parameters, which enable control of the local electrical field within the space arranged between adjacent diode chains 8. In particular, the value of local electrical field preferably is as low as possible so as to prevent premature failure and/or other instability due to surface charges, defects, or process spread.

The advantages of the device described are evident from the foregoing description.

In particular, introduction of the plurality of diode chains 8 enables control of the distribution of potential (and, thus, of electrical field) within the integrated electronic device 1, in a way independent (to a first approximation) of the environmental conditions and of the presence of surface charges, defects, and/or manufacturing-process spread, and without increasing the area occupied by the integrated electronic device 1.

In particular, the use of Zener diodes (the breakdown voltage of which is relatively low, for example not higher than $\frac{1}{50}$ of the aforementioned voltage class $V_{CES}$) guarantees a high precision in the control of the potential drop. In this connection, if the diodes were not of a Zener type, they could find themselves operating at very high reverse voltages, which could generate an unbalancing of the electrical field.

Finally, it is clear that modifications and variations may be made to the device described and illustrated herein, without thereby departing from the scope of the present disclosure.

For instance, the power device 15 may be other than an IGBT and may thus, for example, be a power MOS device.

The polysilicon region 12 may be replaced by a region having, for example, the same geometry, but of a different semiconductor material.

The number of edge chains and of curved regions may be different from what has been described.

More in general, the geometry of the integrated electronic device may be different from what has been described. In particular, the geometry of the region of polysilicon (or other material) may be different; also the arrangement of the diode chains may thus be different.

Finally, the doping types may be reversed with respect to what has been described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated electronic device, comprising:
    a semiconductor body;
    a first conductive region and a second conductive region, which extend on top of the semiconductor body, the second conductive region surrounding, at a distance, the first conductive region; and
    an edge termination structure, arranged between the first and second conductive regions and including a dielectric region, which delimits an active area of the electronic device, said first conductive region extending at least in part on top of the active area, wherein:
        the edge termination structure further comprises a semiconductive structure, which extends on top of the dielectric region and comprises a plurality of diode chains, each diode chain having a first end and a second end, which are electrically coupled, respectively, to the first and second conductive regions;
        each diode chain comprises a plurality of first semiconductive regions, which have a first conductivity type, and a plurality of second semiconductive regions, which have a second conductivity type, said first and second semiconductive regions being arranged in alternating fashion so as to form a series circuit including a plurality of first and second diodes having opposite orientations;
        the plurality of diode chains includes a plurality of sets of diode chains;
        said dielectric region has an annular shape and comprises a plurality of rectilinear portions; and
        a corresponding set of diode chains of the plurality of sets of diode chains is arranged on each rectilinear portion.

2. The device according to claim 1, wherein, in each diode chain, adjacent semiconductive regions are arranged in contact with one another.

3. The device according to claim 1, wherein said dielectric region comprises at least one rectilinear portion; and wherein said diode chains have elongated shapes parallel to a direction of extension, which is transverse, but not perpendicular, to a direction in which said rectilinear portion longitudinally extends.

4. The device according to claim 1, wherein each set of diode chains comprises a respective number of complete diode chains, which are the same as one another.

5. The device according to claim 4, wherein the first and second ends of each of said complete diode chains contact the first and second conductive regions, respectively.

6. The device according to claim 5, wherein:
    the plurality of rectilinear portions includes a first rectilinear portion and a second rectilinear portion;
    the dielectric region comprises at least one curved portion, which is arranged between the first and second rectilinear portions
    the plurality of sets of diode chains includes a first set of diode chains arranged on the first rectilinear portion, and a second set of diode chains arranged on the second rectilinear portion; and
    the first set of diode chains further comprises at least one first edge diode chain, which is closer to said curved portion than the other diode chains of said first set and includes a total number of first and second semiconductive regions smaller than the total number of first and second semiconductive regions of the other diode chains of the first set;
    the second set of chains further comprises at least one second edge diode chain, which is closer to said curved portion than the other diode chains of the second set and includes a total number of first and second semiconductive regions smaller than the total number of first and second semiconductive regions of the other diode chains of the second set of chains;
    the first end of the at least one first edge diode chain and the second end of the second edge diode chain contact the first and second conductive regions, respectively; and
    said semiconductive structure further comprises at least one curved semiconductive region, which is electrically arranged between the second end of the first edge diode chain and the first end of the second edge diode chain.

7. The device according to claim 6, wherein the curved semiconductive region, the second end of the first edge diode chain and the first end of the second edge diode chain have a same conductivity type.

8. The device according to claim 6, wherein the curved semiconductive region is made of polysilicon.

9. The device according to claim 1, wherein said first and second diodes are Zener diodes.

10. The device according to claim 1, wherein said diode chains are made of polysilicon.

11. A power device, comprising:
    a semiconductor body;
    a power transistor formed in or on the semiconductor body;

a first conductive region and a second conductive region, which extend on top of the semiconductor body, the second conductive region surrounding, at a distance, the first conductive region; and an edge termination structure, arranged between the first and second conductive regions and including a dielectric region, which delimits an active area of the power device, said first conductive region extending at least in part on top of the active area, wherein:

the edge termination structure further comprises a semiconductive structure, which extends on top of the dielectric region and comprises a plurality of diode chains, each diode chain having a first end and a second end, which are electrically coupled, respectively, to the first and second conductive regions;

each diode chain comprises a plurality of first semiconductive regions, which have a first conductivity type, and a plurality of second semiconductive regions, which have a second conductivity type, said first and second semiconductive regions being arranged in alternating fashion so as to form a series circuit including a plurality of first and second diodes having opposite orientations;

the plurality of diode chains includes a plurality of sets of diode chains;

said dielectric region has an annular shape and comprises a plurality of rectilinear portions; and a corresponding set of diode chains of the plurality of sets of diode chains is arranged on each rectilinear portion.

12. The device according to claim 11, wherein the power transistor is an IGBT or a MOSFET.

13. The device according to claim 11, wherein said dielectric region comprises at least one rectilinear portion; and wherein said diode chains have elongated shapes parallel to a direction of extension, which is transverse, but not perpendicular, to a direction in which said rectilinear portion longitudinally extends.

14. An integrated electronic device comprising:
a semiconductor body;
a first conductive region and a second conductive region, which extend on top of the semiconductor body, the second conductive region being spaced apart from the first conductive region; and an edge termination structure arranged between the first and second conductive regions and delimiting an active area of the electronic device, said first conductive region extending at least in part on top of the active area, wherein:

the edge termination structure includes a dielectric layer and a plurality of diode chains formed on the dielectric layer, each diode chain having a first end and a second end, which are electrically coupled, respectively, to the first and second conductive regions;

each diode chain comprises a plurality of first semiconductive regions, which have a first conductivity type, and a plurality of second semiconductive regions, which have a second conductivity type, said first and second semiconductive regions being arranged in alternating fashion so as to form a series circuit including a plurality of first and second diodes the plurality of diode chains includes a plurality of sets of diode chains;

said dielectric region has an annular shape and comprises a plurality of rectilinear portions; and a corresponding set of diode chains of the plurality of sets of diode chains is arranged on each rectilinear portion.

15. The device according to claim 14, further comprising a power transistor in which the first conductive region implements a conduction terminal of the power transistor.

16. The device according to claim 14, wherein said dielectric region comprises at least one rectilinear portion; and wherein said diode chains have elongated shapes parallel to a direction of extension, which is transverse, but not perpendicular, to a direction in which said rectilinear portion longitudinally extends.

17. The device according to claim 14, wherein the second conductive region lateral surrounds, at a distance, the first conductive region.

* * * * *